United States Patent [19]

Fujimaki

[11] Patent Number: 5,701,088
[45] Date of Patent: Dec. 23, 1997

[54] METHOD OF EVALUATING A MIS-TYPE SEMICONDUCTOR DEVICE

[75] Inventor: Nobuyoshi Fujimaki, Annaka, Japan

[73] Assignee: Shin-Etsu Handotai Co., Ltd, Tokyo, Japan

[21] Appl. No.: 534,460

[22] Filed: Sep. 27, 1995

[30] Foreign Application Priority Data

Sep. 30, 1994 [JP] Japan .................................. 6-261094

[51] Int. Cl.$^6$ .............................. G01R 31/00; H01L 21/00
[52] U.S. Cl. ............................. 324/765; 324/769; 437/8
[58] Field of Search .................................. 324/765, 769, 324/71.1; 437/8

[56] References Cited

U.S. PATENT DOCUMENTS 4,978,915  12/1990  Andrews, Jr. et al. .................. 324/765

FOREIGN PATENT DOCUMENTS

| A-55-065145 | 5/1980 | Japan . |
| A-57-075439 | 5/1982 | Japan . |
| A-61-159748 | 7/1986 | Japan . |
| A-63-012144 | 1/1988 | Japan . |
| A-04-134842 | 5/1992 | Japan . |

*Primary Examiner*—Ernest F. Karlsen
*Assistant Examiner*—Barry C. Bowser
*Attorney, Agent, or Firm*—Ronald R. Snider

[57] ABSTRACT

A method of evaluating a MIS-type semiconductor device which comprises an insulative layer(s) and a conductive layer (s) formed one after another on a semiconductor substrate wherein: using a sample with an interface trapped charge density of $1 \times 10^{10}$/cm$^2 \cdot$eV or less and a mobile ionic charge density of $3 \times 10^{10}$/cm$^2$ or less in said insulative layer, said MIS-type semiconductor device is treated by applying a positive or negative voltage in the range of 1–5 MV/cm between said semiconductor substrate and said conductive layer at a temperature of 100°–300° C. and maintaining this voltage for 1–60 minutes (hereafter referred to as "BT treatment"); before and after said BT treatment, the capacitance-voltage characteristics (hereafter referred to as "C-V characteristics) of said MIS-type semiconductor device are measured at room temperature; and the carrier trap density of said insulative layer is determined based on the shift of the flat band voltage of said C-V characteristics from before to after said BT treatment.

8 Claims, 1 Drawing Sheet

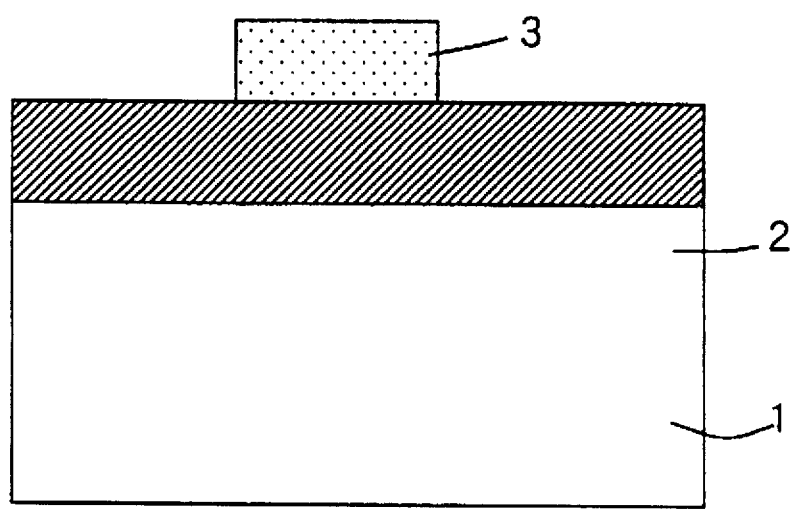
F I G. 1

METHOD OF EVALUATING A MIS-TYPE SEMICONDUCTOR DEVICE

RELATED APPLICATION

This application claims the priority of Japanese Patent application No. 6-261094 filed on Sep. 30, 1994, which is incorporeted herein by reference.

BACKGROUND OF THE INVENTION

1. Field of the Invention

This invention relates in general to a method of evaluating a MIS-type semiconductor device which comprises an insulative layer and a conductive layer formed one after another on a semiconductor substrate, and more particularly to a method of measuring the carrier trap density in the insulative layer in a MIS-type semiconductor device.

2. The Prior Art

Four types of electric charges, i.e. fixed oxide charges, interface trapped charges, mobile ionic charges and oxide trapped charges, are known to exist in the insulative layer in a MIS-type semiconductor device (for example, refer to IEEE TRANSACTION ON ELECTRON DEVICE, VOL. ED-27, NO. 3, MARCH 1980, pp 606–608). The amounts of these electric charges are calculated by using the high frequency C-V characteristics and the quasi-static C-V characteristics.

FIG. 1 shows the structure of a MIS-type semiconductor device used for this kind of measurement. In this FIGURE, 1 is a semiconductor substrate, for example, made of N-type silicon, 2 is an insulative layer such as a silicon oxide layer, and 3 is a conductive layer such as an aluminum or polysilicon layer. Step-wise bias voltage is applied between the conductive layer 3 and the semiconductor substrate 1 of such a MIS-type semiconductor device and the capacitance is measured to obtain the C-V characteristic curve. To the step-wise bias voltage, a high frequency signal voltage is added to obtain the high frequency C-V characteristic curve and a low frequency signal voltage is added to obtain the quasi-static C-V characteristic curve. Although each C-V characteristic curve can be obtained theoretically, the actual curve deviates from the theoretical curve because there are four types of electric charges as mentioned above. The amounts of charges due to the fixed oxide charges and the interface trapped charges are obtained based on the amount of this deviation.

The amount of mobile ionic charges can also be calculated by using the TVS method (for example, refer to J. Electrochem. Soc.,: Solid State Science, Vol. 118, No. 4, Apl., 1971, pp 601–608). However, the method described below uses the BT (Bias Temperature) treatment and obtains this amount based on the shift of the C-V characteristics from before to after the BT treatment (for example, refer to Japanese Journal of Applied Physics, Vol. 6, No. 2, February, 1967, pp 191–204).

The mobile ionic charges in the insulative layer are alkali metal (Li, Na, K, etc.) ions and they have positive charges. Since the mobile ionic charges can easily move in the insulative layer when they are heated to 100° C. or higher, the amount of the mobile ionic charges can be determined by making them move in the insulative layer by conducting the BT treatment where a prescribed positive or negative voltage is applied on the conductive layer at a prescribed temperature for a prescribed duration of time.

When a BT treatment with a positive voltage applied (hereafter referred to as "positive BT") is conducted, the mobile ionic charges move in the insulative layer toward the semiconductor substrate and therefore the amount of positive charges in the insulative layer near the interface with the semiconductor substrate increases, resulting in shifting of the C-V characteristic curve toward the negative voltage side. On the other hand, when a BT treatment with a negative voltage applied (hereafter referred to as "negative BT") is conducted, the mobile ionic charges move in the insulative layer toward the conductive layer and therefore the amount of positive charges in the insulative layer near the interface with the semiconductor substrate decreases, resulting in shifting of the C-V characteristic curve toward the positive voltage side. Therefore, the amount of the mobile ionic charges in the insulative layer can be determined from the amount of the shift from before to after the BT treatment.

However, it is also known that conducting the BT treatment over a long time, 1000 hours or more for example, results in the formation of many new interface trapped charges due to the structural changes in the insulative layer (refer to J. Electrochem. Soc.,: Solid State Science, Vol. 130, No. 1, January, 1983, pp 138–143).

This method which uses the BT treatment is generally a method to study the electrical instability of the insulative layer of a MIS-type semiconductor device. However, because of large fluctuations in electric charges due to mobile ionic charges, it was not possible to measure the amount of electric charges other than the mobile ionic charges, for example the amount of the electric charges due to carrier traps.

As described above, a positive BT treatment results in movement of the mobile ionic charges in the insulative layer toward the semiconductor substrate and an increase in the amount of positive electric charges in the insulative layer near the semiconductor substrate. Simultaneously, the electrons in the semiconductor substrate are attracted toward the surface of the semiconductor substrate, and, due to the influence of the temperature and the electric field, some electrons are captured in electron traps in the insulative layer. Captured electrons in the electron traps increase the amount of negative electric charges in the insulative layer near the semiconductor substrate. Because of this, there was a problem in that when the amount of mobile ionic charges in the insulative layer is large, the C-V characteristic curve after the positive BT treatment shifts toward the negative voltage along the voltage axis, making it impossible to quantitatively measure the amount of the electron traps.

On the other hand, a negative BT treatment results in movement of the mobile ionic charges in the insulative layer toward the conductive layer and a decrease in the amount of positive electric charges in the insulative layer near the semiconductor substrate. Simultaneously, the holes in the semiconductor substrate are attracted toward the surface of the semiconductor substrate, and, due to the influence of the temperature and the electric field, some holes are captured in hole traps in the insulative layer. Because of this, there is a problem in that when the amount of mobile ionic charges in the insulative layer is large, the C-V characteristic curve after the negative BT treatment shifts toward the positive voltage along the voltage axis, making it impossible to quantitatively measure the amount of the hole traps.

Also, when the density of the interface trapped charges is high, there is a problem in that electrons and holes are easily captured or released via the interface trapped charges by the carrier traps in the insulative layer, making the C-V characteristic curve measured at room temperature steeper or flatter than the theoretical curve, thus resulting in distortion and making it impossible to accurately measure the carrier trap density.

Evaluation of the electrical instability of the insulative layer in a MIS-type semiconductor device is becoming more and more important for the prediction of the characteristics, reliability and yield of semiconductor integrated circuits.

BRIEF SUMMARY OF THE INVENTION

The object of the present invention is to provide a method of evaluating the electrical instability of the insulative layer with high reproducibility and accuracy when evaluating the electrical characteristics of a MIS-type semiconductor device.

The present invention attempts to solve the problem described above by introducing a method of evaluating a MIS-type semiconductor device which comprises an insulative layer (s) and a conductive layer(s) formed one after another on a semiconductor substrate wherein: using a sample with an interface trapped charge density of $1 \times 10^{10}/cm^2 \cdot eV$ or less and a mobile ionic charge density of $3 \times 10^{10}/cm^2$ or less in said insulative layer, said MIS-type semiconductor device is treated by applying a positive or negative voltage in the range of 1–5 MV/cm between said semiconductor substrate and said conductive layer at a temperature of 100°–300° C. and maintaining this voltage for 1–60 minutes (hereafter referred to as "BT treatment"); before and after said BT treatment, the capacitance-voltage characteristics (hereafter referred to as "C-V characteristics) of said MIS-type semiconductor device are measured at room temperature; and the carrier trap density of said insulative layer is determined based on the shift of the flat band voltage of said C-V characteristics from before to after said BT treatment.

For the temperature, electric field and time, if they are less than their lower limits then there will be insufficient carrier traps, and if they are more than their upper limits then there may be new interface trapped charges generated. Therefore, they are limited to the prescribed ranges.

In order to accurately determine the density of the carrier traps mentioned above, it is necessary to minimize the amount of the mobile ionic charges and the density of the interface trapped charges. It was found that improvements in cleanliness in terms of perspiration and clothing of the operators, atmosphere in the clean room, the dew point of the gas(es), the grades of the cleaning solution and such as well as manufacturing apparatus could reduce the mobile ionic charges and the interface trapped charges.

When a positive BT treatment is conducted with a reduced amount of mobile ionic charges, electrons are attracted to the surface of the semiconductor substrate and, due to the influence of the temperature and the electric field, some electrons are captured by the electron traps in the insulative layer. When the electrons are trapped by the electron traps, the amount of negative charges increases in the insulative layer near the semiconductor substrate. As a result, the C-V characteristic curve shifts in the direction of the positive voltage along the voltage axis. On the other hand, when a negative BT treatment is conducted, holes are attracted to the surface of the semiconductor substrate and, due to the influence of the temperature and the electric field, some holes are captured by the hole traps in the insulative layer. When the holes are trapped by the hole traps, the amount of positive charges increases in the insulative layer near the semiconductor substrate. As a result, the C-V characteristic curve shifts in the direction of the negative voltage along the voltage axis.

When the density of the interface trapped charges is reduced, the slope of the C-V characteristic curve measured at room temperature is free of distortion, allowing accurate determination of the carrier trap density.

As described thus far, the present invention makes it possible to take accurate relative measurements of the amount of the carrier traps in the insulative layer in a MIS-type semiconductor device by reducing the amount of the mobile ionic charges and the interface trapped charge in the insulative layer in the MIS-type semiconductor device and limiting the conditions of the BT treatment.

BRIEF DESCRIPTION OF THE DRAWING

FIG. 1 is a schematic cross-section showing the configuration of a MIS-type semiconductor device.

DETAILED DESCRIPTION

The present invention is described in detail below by referring to examples.

[EXAMPLE 1]

A silicon wafer(s) grown by using the CZ method was prepared which had a diameter of 5 inches, a plane orientation of (100), a conductivity type of P-type, a specific resistance of 10 ohm-cm, and an interstitial oxygen concentration of approximately $1.4 \times 10^{18}$ atoms/cm$^3$.

A MIS capacitor was then prepared according to the following conditions. A Si wafer(s) went through a cleaning process to clean its surface before the oxidation process. After drying up, it was immediately inserted into an oxidation furnace. A gate oxide layer was grown to 50 nm in a dry oxygen ambient at 1000° C. for 60 minutes. The samples oxidized here were designated as No. 1-1 to 1-3. Some samples which went through cleaning and oxidization under the same conditions additionally received a heat treatment in a nitrogen ambient (hereafter referred to as "nitrogen annealing") for an hour and were designated as No. 2-1 to 2-3. All of these samples were loaded in one batch and the vacuum evaporation method was employed to form an approximately 1 micrometer-thick Al electrode(s) using a metal mask(s) on the silicon oxide layer (s). After removing the silicon oxide layer(s) on the back side, a heat treatment was conducted at 400° C. for 30 minutes in a gas mixture of 3% hydrogen and 97% nitrogen.

The silicon wafers and MIS capacitors described above were prepared in a very high cleanliness where the atmosphere in the clean room, the dew point of the gashes), the grade of the cleaning solution(s), manufacturing apparatus, perspiration and clothing of the operators, etc. were sufficiently controlled.

Using a MIS capacitor with a gate area of 1.81 mm$^2$, a BT treatment (temperature: 250° C., electric field intensity: 3 MV/cm, time: 30 minutes) was conducted, and the C-V characteristic curve was measured at room temperature before and after this BT treatment. The amount of charges calculated from the shift of $V_{FB}$ is shown in Table 1. After the BT treatment, the C-V characteristic curves for the samples No. 2-1 to 2-3 simply shifted along the voltage axis and its slope was not distorted. This indicates that new interface trapped charges were not generated by the BT treatment.

The interface state density at a mid-gap voltage obtained from the quasi-static C-V characteristics was measured at 6 points per wafer. It was $3.9 \times 10^9$ to $8.3 \times 10^9/cm^2 \cdot eV$ for the samples No. 1-1 to 1-3, and $2.2 \times 10^9/cm^2 \cdot eV$ or less for the samples No. 2-1 to 2-3.

TABLE 1

| Sample Wafer No. | Positive BT ΔNox (cm⁻²) × 10¹⁰ | Negative BT ΔNox (cm⁻²) × 10¹⁰ |
| --- | --- | --- |
| 1-1 | −4.586 | 40.89 |
| 1-2 | −1.280 | 38.33 |
| 1-3 | −3.430 | 46.42 |
| 2-1 | 2.995 | 6.364 |
| 2-2 | 2.475 | 7.724 |
| 2-3 | 1.760 | 7.256 |

Table 1 indicates that while the amount of the mobile ionic charges is $3 \times 10^{10}/\text{cm}^2$ or less and the hole trap density is approximately $7 \times 10^{10}/\text{cm}^2$ in the insulative layer which received the nitrogen annealing treatment after the formation of oxide layer, the electron trap density is approximately $1.2 \times 10^{10}$ to $4.6 \times 10^{10}/\text{cm}^2$ and the hole trap density is approximately $4 \times 10^{11}/\text{cm}^2$ in the insulative layer which did not receive the nitrogen annealing treatment.

In Table 1, a positive value indicates that positive electric charges, i.e. the charge due to the holes captured by hole traps, was generated in the insulative layer near the semiconductor substrate by the BT treatment (after the BT treatment, the C-V characteristic curve shifts in the direction of the negative voltage along the voltage axis), and a negative value indicates that negative electric charge, i.e. the charge due to the electrons captured by electron traps, was generated in the insulative layer near the semiconductor substrate by the BT treatment (after the BT treatment, the C-V characteristic curve shifts in the positive direction along the voltage axis).

[COMPARATIVE EXAMPLE 1]

A silicon wafer(s) grown by using the CZ method was prepared which had a diameter of 5 inches, a plane orientation of (100), a conductivity type of P-type, a specific resistance of 10 ohm-cm, and an interstitial oxygen concentration of approximately $1.4 \times 10^{18}$ atoms/cm³.

A MIS capacitor was then prepared according to the following conditions. A Si wafer(s) went through a cleaning process to clean its surface before the oxidation process. After drying up, it was immediately inserted into an oxidation furnace. A gate oxide layer was grown to 50 mn in a wet oxygen atmosphere at 950° C. for 8.5 minutes, after which one hour of nitrogen annealing was added. During this process, the dew point of hydrogen was controlled, and the samples with a hydrogen dew point of −62° C. were designated as No. 3-1 to 3-3, the samples with a hydrogen dew point of −68° C. were designated as No. 4-1 to 4-3, and the samples with a hydrogen dew point of −74° C. were designated as No. 5-1 to 5-3. For these samples, the vacuum evaporation method was employed to form an approximately 1 micrometer-thick Al electrode(s) using a metal mask(s) on the silicon oxide layer(s). After removing the silicon oxide layer(s) on the back side, a heat treatment was conducted at 400° C. for 30 minutes in a mixed atmosphere of 3% hydrogen and 97% nitrogen.

Using a MIS capacitor with a gate area of 1.81 mm², a BT treatment (temperature: 250° C., electric field intensity: 3 MV/cm, time: 30 minutes) was conducted, and the C-V characteristic curve was measured at room temperature before and after this BT treatment. The amount of charges calculated from the shift of $V_{BF}$ is shown in Table 2. After the BT treatment, the C-V characteristic curves not only shifted along the voltage axis but also its slope was distorted. This indicates that new interface trapped charges were generated by the BT treatment.

Table 2 indicates that because of the reduced purity due to an increase in the dew point of the ambient gas in the oxide layer forming process, there are mobile ionic charges on the order of $10^{11}$–$10^{12}/\text{cm}^2$ in the insulative layer and hence it is not possible to determine the density of electron traps or hole traps.

In this table, a positive value indicates that the BT treatment increased the amount of the mobile ionic charges in the insulative layer near the semiconductor substrate (after the BT treatment, the C-V characteristic curve shifts in the negative direction along the voltage axis), and a negative value indicates that the BT treatment decreased the amount of the mobile ionic charges in the insulative layer near the semiconductor substrate (after the BT treatment, the C-V characteristic curve shifts in the positive direction along the voltage axis).

TABLE 2

| Sample Wafer No. | Positive BT ΔNox (cm⁻²) × 10¹⁰ | Negative BT ΔNox (cm⁻²) × 10¹⁰ |
| --- | --- | --- |
| 3-1 | 246 | −22.46 |
| 3-2 | 107 | −18.77 |
| 3-3 | 81.2 | −13.58 |
| 4-1 | 28.34 | −9.134 |
| 4-2 | 20.12 | −8.243 |
| 4-3 | 10.76 | −7.547 |
| 5-1 | 11.27 | −3.631 |
| 5-2 | 9.43 | −3.221 |
| 5-3 | 6.57 | −2.758 |

As described thus far, the present invention makes it possible to measure carrier traps, which have been impossible to measure with conventional methods, by using a method of evaluating a MIS-type semiconductor device wherein: using a sample with an interface trapped charge density of $1 \times 10^{10}/\text{cm}^2 \cdot \text{eV}$ or less and a mobile ionic charge density of $3 \times 10^{10}/\text{cm}^2$ or less in said insulative layer, said MIS-type semiconductor device is given a BT treatment by applying a positive or negative voltage in the range of 1–5 MV/cm between said semiconductor substrate and said conductive layer at a temperature of 100°–300° C. and maintaining this voltage for 1–60 minutes; before and after said BT treatment, the C-V characteristics of said MIS-type semiconductor device are measured at room temperature; and the carrier trap density of said insulative layer is determined based on the shift of the flat band voltage of said C-V characteristics from before to after said BT treatment.

What is claimed is:

1. A method of evaluating a MIS-type semiconductor device which comprises an insulative layer(s) and a conductive layer(s) formed one after another on a semiconductor substrate wherein: using a sample with an interface trapped charge density of $1 \times 10^{10}/\text{cm}^2 \cdot \text{eV}$ or less and a mobile ionic charge density of $3 \times 10^{10}/\text{cm}^2$ or less in said insulative layer; said MIS-type semiconductor device is treated by applying a positive or negative voltage in a range of 1–5 MV/cm between said semiconductor substrate and said conductive layer at a temperature of 100°–300° C. and maintaining this voltage for 1–60 minutes (hereafter referred to as "BT treatment"); before and after said BT treatment, a capacitance-voltage characteristic (hereafter referred to as "C-V characteristic") of said MIS-type semiconductor device is measured at room temperature; and a carrier trap density of said insulation is determined based on a shift of a flat band voltage of said C-V characteristics from before to after said BT treatment.

2. A method of evaluating a MIS-type semiconductor device which comprises an insulative layer(s) and a conductive layer(s) formed one after another on a semiconductor substrate comprising the steps of:

using a sample with an interface trapped charge and a mobile ionic charge in said insulative layer;

treating said MIS-type semiconductor device by applying a single bias voltage (either positive only or negative only) between said semiconductor substrate and said conductive layer (hereafter referred to as "BT treatment");

measuring a capacitance-voltage characteristic (hereafter referred to as "C-V characteristic") of said MIS-type semiconductor device at room temperature before and after said BT treatment; and determining a carrier trap density of said insulative layer based on a shift of a flat band voltage of said C-V characteristics from before to after said BT treatment.

3. A method according to claim 2, wherein the interface trapped charge density is no more than $1 \times 10^{10}/cm^2 \cdot eV$ and the mobile ionic charge density is no more than $3 \times 10^{10}/cm^2$.

4. A method according to claim 2, wherein the single bias voltage that applies between said semiconductor substrate and said conductive layer is in a range of 1–5 MV/cm.

5. A method according to claim 2, wherein the BT treatment is at a temperature between 100° and 300° C.

6. A method according to claim 2, wherein the bias voltage is maintained for 1–60 minutes.

7. A method according to claim 2, wherein the bias voltage is a constant voltage.

8. A method according to claim 1, wherein the bias voltage is a constant voltage.

* * * * *